United States Patent [19]

Kamei

[11] Patent Number: 4,559,693

[45] Date of Patent: Dec. 24, 1985

[54] PROCESS FOR FABRICATING FIELD EFFECT TRANSISTORS

[75] Inventor: Kiyoho Kamei, Yokohama, Japan

[73] Assignee: Kabushiki Kaisha Toshiba, Japan

[21] Appl. No.: 638,570

[22] Filed: Aug. 7, 1984

[30] Foreign Application Priority Data

Sep. 27, 1983 [JP] Japan ............................ 58-176898

[51] Int. Cl.⁴ .................. H01L 21/265; H01L 29/80
[52] U.S. Cl. .................................... 29/571; 29/576 B;
29/578; 29/591; 148/DIG. 82; 357/22; 357/23.3
[58] Field of Search ................... 29/571, 576 B, 578, 29/591; 148/1.5, DIG. 82; 357/15, 22, 23.3, 91

[56] References Cited

U.S. PATENT DOCUMENTS 4,359,816  11/1982  Abbas et al. ................. 29/578 X
4,426,767  1/1984   Swanson et al. ............... 29/571

FOREIGN PATENT DOCUMENTS 50-12984  2/1975  Japan .

OTHER PUBLICATIONS

Proc. of 44th Autumn Meeting of the Jap. Soc. of Appl. Phys., and of the Related Soc. p. 543 26p-E-13, Reporters: Terada et al., 1983.

Proc. of 44th Autumn Meeting of the Jap. Soc. of Appl. Phys. and of the Related Soc. p. 509 25a-J-10, Reporters: Katano et al., 1983.

*Primary Examiner*—Donald L. Walton
*Assistant Examiner*—Alan E. Schiavelli
*Attorney, Agent, or Firm*—Finnegan, Henderson, Farabow, Garrett & Dunner

[57] ABSTRACT

A process for fabricating a field effect transistors having a source electrode, a drain electrode and a gate electrode, including the steps of forming first to third conjoined narrow portions of thin film on an active region of a semiconductor, the second thin film portion having a different etching rate from the first and third and implanting ions into the active region to form a high carrier concentration region by using the conjoined films as a mask. The thickness of the second film portion determines the gate electrode length and the thickness of the third film portion determines the distance between the high carrier concentration region at the source side and the gate electrode.

3 Claims, 11 Drawing Figures

PROCESS FOR FABRICATING FIELD EFFECT TRANSISTORS

BACKGROUND OF THE INVENTION

The present invention relates to a process for fabricating a Schottky barrier gate field effect transistor (FET) for improving the electric characteristics of, for example, a high-frequency transistor.

DESCRIPTION OF THE PRIOR ART

Desired characteristics of a high-frequency field effect transistor are (1) low source resistance, (2) high breakdown voltage of the gate-drain path, (3) low feedback capacitance between a gate and a drain, and (4) a short gate length of sub-microns with reliable reproducibility. The field effect transistor, for example GaAs Metal Semiconductor (MES) FET, has already been used in many applications of microwave devices. However, efforts to improve the performance of the MES FET continue so that the performance of the various microwave devices, utilizing the FET, may be improved.

One example of the conventional MES FET is shown in FIG. 1. On a semiconductor substrate 1 of GaAs, there is epitaxially grown a buffer layer 2 and an active layer 3. A source electrode 4, a gate electrode 5 and a drain electrode 6 are formed on the active layer 3.

In order to improve the performance of the MES FET, it is important to reduce the gate length to a minimum value and to decrease the source resistance. Recently, the gate length has been reduced by making use of direct exposure with an electron beam so that a MES FET having a gate length of 0.25 $\mu$m is put into practice. In order to decrease the source resistance, on the other hand, as shown in FIG. 1, the gate electrode is formed in a deep recess between the source and the drain. In the fabrication of the gate of such an MES FET, present electron beam exposing devices are expensive and have a bad throughput. Moreover, the formation of the recess structure causes difficulties in that differences in the recess structure cause variations in electric current through the FET and it is very difficult to control the etching operation with absolute precision.

With a view to attaining improved and uniform characteristics of the MES FET and reducing its cost, ion implantation technique has recently been used. In the use of ion implantation however, it is difficult to form a thick active layer so that the deep recess structure of the gate, as described above, cannot be adopted. In order that the high uniformity of ion distribution which is the advantage of the ion implantation, may not be lost, therefore an effort has been made to use a more shallow recess structure.

Reduction of the depth of the gate recess structure, however, introduces another problem. In keeping the source resistance low it is important to minimize the distance between the source and the gate. When the active layer is substantially planar, conventional masking methods do not provide sufficient gate - source distance, since alignment is limited to about 1 $\mu$m. Therefore, there has been proposed a method of forming the source and the gate in a self-aligning manner.

A typical example of a self-aligned MES FET is shown in FIG. 2. In this MES FET, a high carrier concentration layer for providing a source region 7 and a drain region 8 is formed by ion implantation by using a high melting point gate metal layer (i.e., the gate electrode) 5 as a mask. As a result, the source region 7 is formed closely to an edge of the gate electrode 5 so that the distance between the source region and the gate can be reduced to ideally decrease the source resistance. Since the drain region 8 is also formed closely to an edge of the gate electrode 5, however, the gate-drain breakdown voltage is consequently dropped to an impractical level. If the gate electrode 5 and the drain region 8 come quite close to each other, moreover, the feedback capacitance between the gate and the drain is greatly augmented so that the high-frequency characteristics of the FET are deteriorated.

SUMMARY OF THE INVENTION

An object of the present invention is, therefore, to provide a process for fabricating field effect transistors having a low source resistance, a sufficiently high gate-drain breakdown voltage and a small gate-drain feedback capacitance with a gate electrode having a size of sub-microns, all with excellent reproducibility.

In order to achieve the above object of the present invention, a process for fabricating field effect transistors is provided comprising the steps of— forming a first thin film having an end face on a active region of a semiconductor substrate, coating said end face with a second film which has an end face on the surface opposite said end face of said first thin film, coating said end face of said second film with a third thin film having an end face on the surface opposite said end face of said second thin film, the thin films being thus conjoined;

implanting ions to form a high carrier concentration region by using said conjoined films as mask, forming a source electrode and a drain electrode on said high carrier concentration region, and forming a gate electrode as a Schottky barrier on a surface of said active region exposed by removing said second thin film from between said first and third films.

DESCRIPTION OF THE PREFERRED EMBODIMENTS

One embodiment of the present invention will be described in detail in the order of steps with reference to FIGS. 3 to 11.

Figure 3:
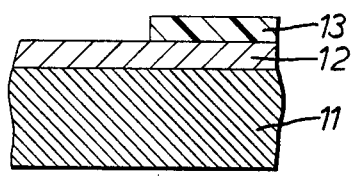

First, a crystal surface is formed on a semiconductor substrate 11 as an active layer 12 by implanting silicon ions in a density of $3 \times 10^{12}$ cm$^{-2}$. A first film 13, e.g., a SiO$_2$ film having a thickness of about 5000 Å (as shown in FIG. 3), is selectively formed on the crystal surface.

Figure 4:
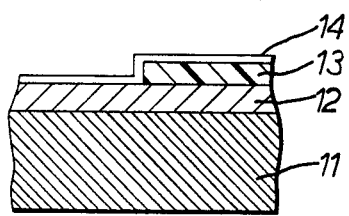

Next, the first film is laminated with a second film 14, e.g., a SiN$_x$ film, having an etching characteristic different from that of the first film, to have a thickness of about 2000 Å by the plasma Chemical Vapour Deposition (CVD) method (as shown in FIG. 4).

Figure 1:
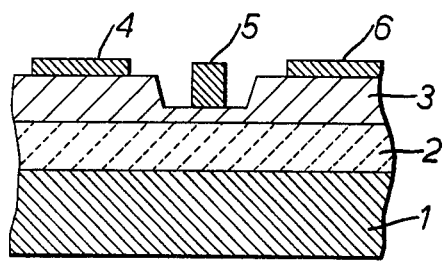
FIGS. 1 and 2 are sectional views showing field effect transistors of the prior art.
Figure 5:
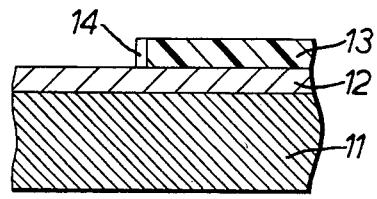
FIGS. 3 to 11 are sectional views showing in the order of steps of the process for fabricating a field effect transistor according to the one embodiment of the present invention.
Figure 2:
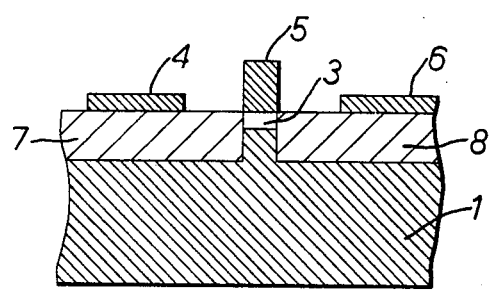

Subsequently, any SiN$_x$ film 14, not coating the edge faces of the selectively formed SiO$_2$ film 13 is removed by reactive ion etching means as by using $C_2F_6$ gas (as shown in FIG. 5).

Figure 6:
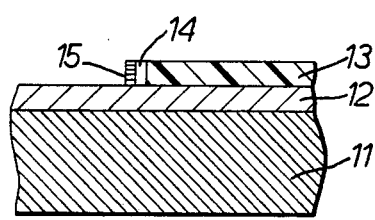

Next, a $SiO_2$ film 15 having a thickness of about 1500 Å is formed by the plasma CVD method on the film 14 and removed by the means similar to the above, leaving only $SiO_2$ film on the end face of the $SiN_x$ film 14 (as shown in FIG. 6).

Figure 7:
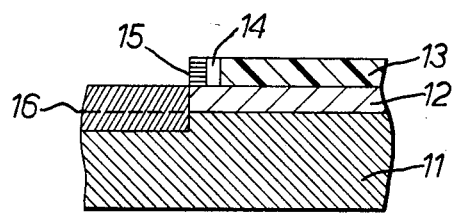

By using the thin film 13 conjoined with the films 14 and 15 on the end faces thereof thus formed as a mask, Si ions are implanted at voltages of 120 KeV and 250 KeV and in a density of $2\times10^{13}cm^{-2}$ to form a high carrier concentration region 16 (as shown in FIG. 7).

Figure 8:
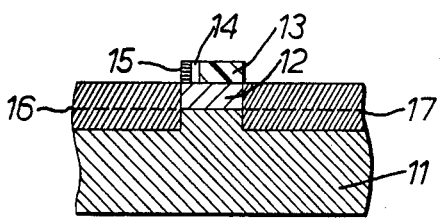

Next, by the usual photoetching method, the first $SiO_2$ film 13 is formed with a hole in a position spaced 1 to 2 μm from the $SiN_x$ film 14, and ion implantation similar to the above is undergone to form a second high carrier concentration region 17 (as shown in FIG. 8).

Figure 9:
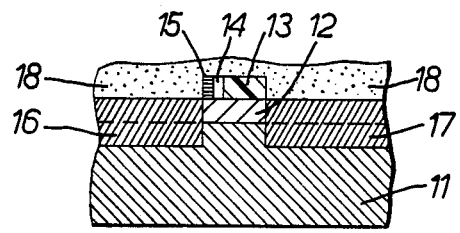
Figure 10:
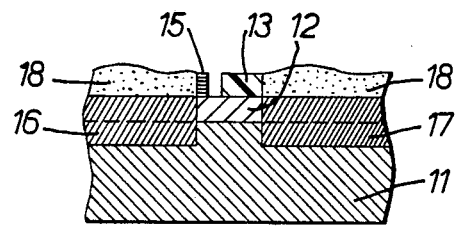
Figure 11:
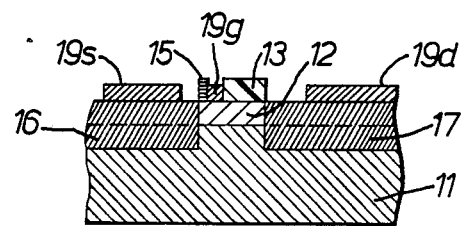

Next, a photo resist film 18 is made by spin coating (as shown in FIG. 9), and the portion of the photo resist film on the thin films 13, 14, 15 is removed by the reactive etching method using $O_2$ gas. Next, the $SiN_x$ film 14 is removed by the plasma etching method using $CF_4$ gas thereby to expose a portion of the active layer 12 (as shown in FIG. 10). The exposed face is formed with a gate electrode 19g of Al, whereas the two high carrier concentration regions 16 and 17 are formed with a source electrode 19s and a drain electrode 19d, respectively. The photo resist film 18 protects the surfaces of the two high carrier concentration regions 16 while the film 14 is being removed and is then removed.

As is apparent from the description thus far made, the size of the gate electrode can be determined by the thickness of the thin film 14, which can be easily controlled, i.e., by adjusting the reaction time when the $SiN_x$ film is formed. On the other hand, the distance between the source region and the gate can be arbitrarily selected by controlling the thickness of the insulating film 15 so that a low source resistance can be realized in a excellently reproducible manner. The insulating film 15 need not be formed in case the gate-source breakdown voltage may be low, but the insulating film should have a thickness of 1000 to 3000 Å in case the MES FET is used in the usual microwave circuit.

The distance of the high carrier concentration region 17 at the drain side from the gate electrode 19g is set at 1 to 2 μm by the usual photoetching method. In the case of this size, the gate-drain breakdown voltage which is an important role upon operation of the MES FET can be reserved at a level higher than 10 V, and the gate-drain feedback capacitance can be maintained at a low value. In the present embodiment, the high carrier concentration region 17 is formed at the drain side. However, the contribution of the drain side resistance to the high-frequency characteristics of the MES FET is so low that the high carrier concentration region 17 need not necessarily be formed.

In the embodiment thus far described, after the $SiO_2$ film 15 is formed, it is etched and removed excepting its portion on the side face of the $SiN_x$ film 14, followed by the ion implantation. After the $SiO_2$ film 15 is formed, however, the ion implantation may be conducted through the $SiO_2$ film, and the $SiO_2$ film other than its portion on the $SiN_x$ film 14 may be removed midway of the subsequent step. The removal of the $SiO_2$ film 15 at the subsequent step is often effective for keeping the semiconductor surface clean because the surface is protected by the thin film.

In the embodiment of the present invention, GaAs preferably is used as the semiconductor, and the $SiO_2$ and $SiN_x$ are used as the thin films. The present invention is not limited thereto but can be modified, for example, such that the semiconductor is made of InP or the like whereas the thin films are made of other insulating films such as SiON, $Al_2O_3$ or a metal film such as Mo. However, in case the first and third thin films 13 and 18 as described in the present embodiment are made of metal films, they have to be removed after the electrodes are formed.

What is claimed is:

1. A process for fabricating field effect transistors comprising the steps of:
    forming a first thin film on an active region of a semiconductor substrate;
    coating an end face of said first film with a second thin film forming a second end face;
    coating said second end face of said second film with a third thin film forming a third end face, the thin films thus conjoined, said first and third films having a different etching characteristics from that of said second film;
    implanting ions into said active region to form a high carrier concentration region by using said conjoined films as a mask;
    forming a source electrode on said high carrier concentration region;
    forming a drain electrode on said active region spaced from said conjoined films and on the opposite side thereof from said source electrode; and
    forming a gate electrode as a Schottky barrier on a surface of said active region exposed by removing said second thin film from between said first and third thin films.

2. A process for fabricating field effect transistors as defined in claim 1 wherein said first thin film is made of $SiO_2$; said second thin film is made of $SiN_x$; and said third thin film is made of $SiO_2$.

3. A process for fabricating field effect transistors as defined in claim 1 wherein the ion implantation is conducted in a state in which said first and second thin films are covered with said third thin film, and wherein said third thin film is then removed excepting its portion along the end face of said second thin film.

* * * * *